(12) United States Patent
Arana et al.

(10) Patent No.: US 7,971,347 B2
(45) Date of Patent: Jul. 5, 2011

(54) METHOD OF INTERCONNECTING WORKPIECES

(75) Inventors: Leonel Arana, Phoenix, AZ (US); Rob Nickerson, Chandler, AZ (US); Lim Chong Sim, Penang (MY); Edward Prack, Phoenix, AZ (US); Yoshihiro Tomita, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 417 days.

(21) Appl. No.: 12/215,550

(22) Filed: Jun. 27, 2008

(65) Prior Publication Data

US 2009/0320281 A1 Dec. 31, 2009

(51) Int. Cl.
*H05K 3/30* (2006.01)

(52) U.S. Cl. ............... 29/832; 29/830; 29/831; 29/852; 29/856; 29/866

(58) Field of Classification Search ............ 29/842, 29/830, 831, 832, 852, 856, 867, 866; 257/778, 257/777, 783; 174/255, 261; 362/294, 547; 427/100, 98, 97
See application file for complete search history.

(56) References Cited

U.S. PATENT DOCUMENTS

| | | | | |
|---|---|---|---|---|
| 4,569,720 A * | 2/1986 | Schmitkons et al. | ........... | 216/17 |
| 5,857,767 A * | 1/1999 | Hochstein | ............ | 362/294 |
| 5,876,268 A * | 3/1999 | Lamphere et al. | ............. | 451/41 |
| 6,018,196 A * | 1/2000 | Noddin | ........... | 257/777 |
| 6,329,224 B1 * | 12/2001 | Nguyen et al. | ............. | 438/127 |
| 6,495,771 B2 * | 12/2002 | Gaynes et al. | ............. | 174/255 |
| 2002/0081787 A1 | 6/2002 | Kohl | | |
| 2004/0127001 A1 * | 7/2004 | Colburn et al. | ............. | 438/586 |
| 2007/0187818 A1 | 8/2007 | Lyne | | |

FOREIGN PATENT DOCUMENTS

| | | |
|---|---|---|
| JP | 2001196454 A | 7/2001 |
| JP | 2008108847 A | 5/2008 |
| WO | 2009/158250 A2 | 12/2009 |
| WO | 2009/158250 A3 | 4/2010 |

OTHER PUBLICATIONS

PCT International Search Report, Application No. PCT/US2009/047632 dated Feb. 2, 2010, 3 pages.
Dewey, Gilbert; U.S. Appl. No. 11/863,211, filed Sep. 27, 2007.
Joseph Paul Jayachandran, et al., "Air-Channel Fabrication for Microelectromechanical Systems via Sacrificial Photosensitive Polycarbonates"; Jornal of Microelectromechanical Systems, vol. 12, No. 2, Apr. 2003; pp. 147-159.
International Preliminary Report on Patentability received for PCT Patent Application No. PCT/US2009/047632, mailed on Jan. 13, 2011, 6 pages.

\* cited by examiner

*Primary Examiner* — Derris H Banks
*Assistant Examiner* — Tai Nguyen
(74) *Attorney, Agent, or Firm* — Scott M. Lane

(57) ABSTRACT

Embodiments of an apparatus and methods of forming a package on package interconnect and its application to the packaging of microelectronic devices are described herein. Other embodiments may be described and claimed.

6 Claims, 3 Drawing Sheets

US 7,971,347 B2

METHOD OF INTERCONNECTING WORKPIECES

FIELD OF THE INVENTION

The field of invention relates generally to the field of microelectronic devices and, more specifically but not exclusively, relates to semiconductor integrated circuit packaging.

BACKGROUND INFORMATION

Microelectronic devices such as integrated circuits, for example, are typically combined with a workpiece and assembled in a package that is soldered or connected to a printed circuit board prior to use. As microelectronic device performance increases and a physical size of the microelectronic device decreases, connections between multiple die structures and between die structures and other elements become undesirably large and sometimes unreliable.

BRIEF DESCRIPTION OF THE DRAWINGS

The present invention is illustrated by way of example and not as a limitation in the figures of the accompanying drawings, in which.

DETAILED DESCRIPTION

An apparatus and methods of forming package-on-package (PoP) interconnects are described in various embodiments. In the following description, numerous specific details are set forth such as a description of an efficient method to form reliable interconnects between stacked packages while improving manufacturability and reducing warpage and height of the stacked package.

It would be an advance in the art of multi-level packaging, wherein a die mounted on a workpiece is connected to another die on another workpiece to form a stacked package, to enable tighter PoP pitch and a smaller form factor than prior art methods. It would also be an advantage to minimize a total height of the stacked package while providing a reliable interconnect between the two workpieces. It would be a further advantage to form stacked packages using thin flexible workpieces while reducing or eliminating warpage of the workpieces. A reduction in dynamic warpage while enhancing package flatness can result in decreased manufacturing scrap and help minimize a PoP thickness profile. These advantages are particularly useful with contemporary and future mobile internet devices and smartphones that demand enhanced capability and speed while restricting an envelope allowed for a PoP device.

A PoP architecture can be applied to a variety of multi-IC configurations to provide enhanced capabilities in a small form factor by combining components such as a system on a chip and a communications chip, a processor and a memory chip, two or more processors, two or more memory chips, a processor and graphics chip, or a combination of one or more thereof. One such method comprises providing a die on a workpiece with a conductive region. A sacrificial nodule is formed on the conductive region and a protective layer is deposited adjacent to the sacrificial nodule. The sacrificial nodule is removed to form a cavity over the conductive region.

Figure 1:
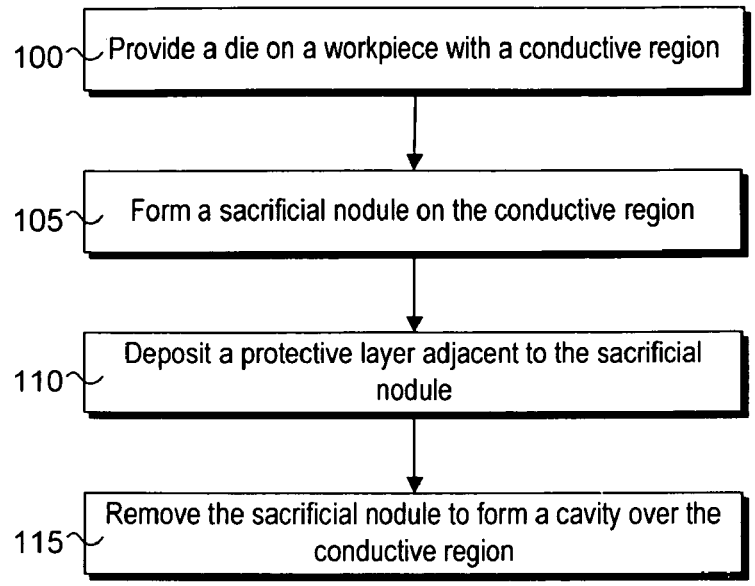
FIG. 1 is a flowchart describing an embodiment of a fabrication process used to form cavities in a protective layer.
Figure 2:
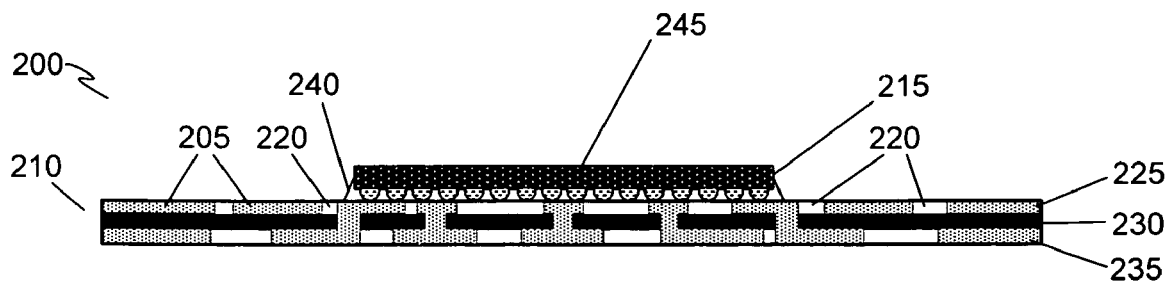
FIG. 2 is a cross-sectional illustration of a die attached to a workpiece with conductive regions formed on an upper surface of the workpiece.

Turning now to the figures, the illustration in FIG. 1 is a flowchart describing an embodiment of method of forming multi-package interconnects. In element 100, a die-attached workpiece 200 with one or more conductive regions 205 is provided. An embodiment of the die-attached workpiece 200 is illustrated in cross-sectional form in FIG. 2. The die-attached workpiece 200 may comprise a workpiece 210 attached to a die 215 having a die top surface 245 and a protective underfill 240. In this embodiment, an upper interface 225, a substrate 230, and a lower interface 235 are combined to form the workpiece 210. The upper interface 225 may comprise conductive regions 205 separated from one another using one or more isolation regions 220. The conductive regions 205 may be formed of a transition metal, alloys thereof, or another conductive material, such as a doped semiconductor, that serves as a transmission medium for electrical current. The conductive regions 205 may be formed of a single conductive material or each conductive region 205 may each be formed from different conductive materials. The isolation regions 220 may be formed of a non-conducting, insulating dielectric material used to isolate the conductive regions 205 from one another.

The workpiece 210 may be a printed wiring board, including conductive patterns adapted to provide interconnection between microelectronic components. In one embodiment, the workpiece 210 is approximately less than 200 microns (μm) in thickness. The substrate 230 may comprise a plurality of flexible layers, such as a stack of organic layers, with one or more conductive vias to connect the upper interface 225 through the substrate 230 to the lower interface 235. The substrate 230 may be formed from one or more layers of polyimide or other polymeric films, an epoxy buildup, a composite of epoxy resin and fibrous and/or particulate fillers of glass silica, flame retardant 4 (FR4), bismaleimide triazine (BT), and liquid crystalline polymer (LCP). The conductive vias may be formed using a transition metal such as copper (Cu), silver (Ag), or gold (Au), though the embodiment is not so limited. Each organic layer may be attached to one another using an adhesive layer. The lower interface may be configured with a plurality of solder balls (not shown) for interfacing another package or circuit board. In another embodiment, a ceramic substrate, a printed circuit board, or a semiconductor substrate such as a silicon substrate used in contemporary semiconductor manufacturing may be used for the substrate 230.

The die 215 may be a microelectronic device such as a processor that may include baseband and applications processing functions and utilize one or more processor cores and/or firmware and hardware in an Application Specific Integrated Circuit (ASIC) device. In an embodiment where the die 215 is a processor, the die 215 may process functions that fetch instructions, generate decodes, find operands, and perform appropriate actions, then store results. The use of multiple cores may allow one core to be dedicated to handle application specific functions such as, for example, graphics, modem functions, etc. Alternatively, the multiple processor cores may allow processing workloads to be shared across the processor cores. In another embodiment, the die 215 is another microelectronic device such as a system on a chip, a communications chip, or a graphics chip.

Figure 3:
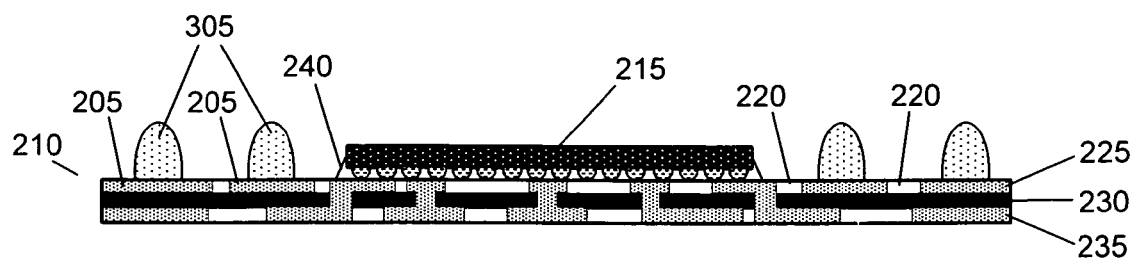
FIG. 3 illustrates the workpiece and attached die of FIG. 2 with sacrificial nodules formed on at least a portion of the conductive regions.

In element 105, a sacrificial nodule is formed on the conductive region 205. FIG. 3 illustrates the cross-sectional view of the die-attached workpiece 200 with a plurality of sacrificial nodules 305 formed on a plurality of conductive regions 215. The sacrificial nodules 305 may be formed using a thixotropic and/or viscous material, such as a polynorbornene or polycarbonate material, that is deposited using one or more methods such as dispense, printing, spin-coating, and pick and place. Once deposited, the sacrificial nodules 305 may be thermally and/or ultraviolet (UV) cured to form a high aspect (height:width) ratio feature. In one embodiment, the aspect ratio ranges approximately between 1:1 and 4:1 or more preferably, the aspect ratio of a sacrificial nodule 305 is approximately 2:1 or greater.

In one embodiment, the sacrificial nodules 305 are formed of a sacrificial material selectively designed to thermally decompose into very light molecules leaving only trace amounts or no sacrificial material behind once thermally processed. In one embodiment, the sacrificial material decomposes between 150 and 300 Celsius (° C.), or more preferably between 100 and 225° C. For example, the sacrificial nodules 305 may be formed using a thixotropic material such as polyethylene carbonate (PEC), polypropylene carbonate (PPC), polycyclohexane carbonate (PCC), polycyclohexanepropylene carbonate (PCPC), polynorbomene carbonate (PNC), a copolymer of polynorbomene and polynorbomene carbonate, and combinations thereof. In one embodiment, a combination of PPC with UV radiation treatment substantially decomposes below 150 degrees Celsius (° C.). In another embodiment, PPC with UV radiation treatment substantially decomposes below 300° C.

Figure 4:
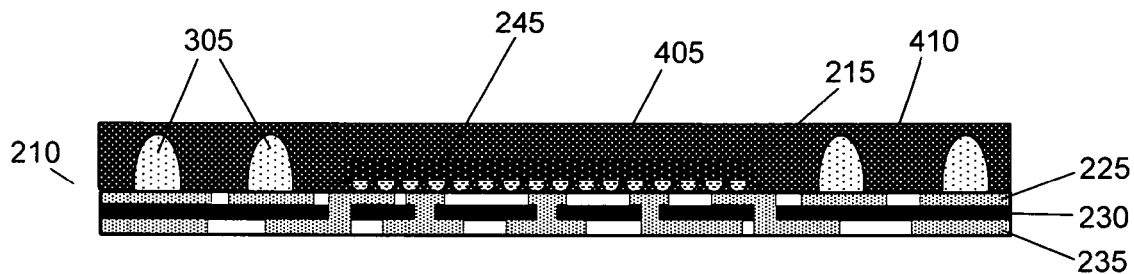
FIG. 4 illustrates the workpiece and attached die of FIG. 3 with a protective layer formed on the die and the sacrificial nodules.

In element 110, a protective layer is deposited adjacent to the sacrificial nodules 305. FIG. 4 illustrates the cross-sectional view of FIG. 3 with the protective layer 405 formed on the workpiece 210 over the sacrificial nodules 305 and the die 215. The protective layer 405, having a protective layer top surface 410, is a multi-functional layer that may be formed of a mold compound selectively designed to protect underlying structures such as the die 215 and the sacrificial nodules 305 that may optionally be used to control warpage of the workpiece 210. The protective layer 405 may be formed from a polymer such as an epoxy. For example, the protective layer 405 may be formed using one or more materials such as Sumitomo Bakelite Co. SFM or Henkel/Dexter molding encapsulation materials. The protective layer 405 may be thermally treated using a post mold process, such as a thermal process in a temperature range between 150 and 200° C., or more preferably between 165 and 185° C. The protective layer 405 may be selected based on its corresponding thermal cure process temperature to allow thermal decomposition of the sacrificial nodules 305, thereby providing an efficient process for curing the protective layer 405 while thermally decomposing the sacrificial nodules 305. Further, the protective layer 405 may be selectively designed to prevent damage to, or to prevent deformation of the sacrificial nodes 305 formed on the conductive regions 205.

Figure 5:
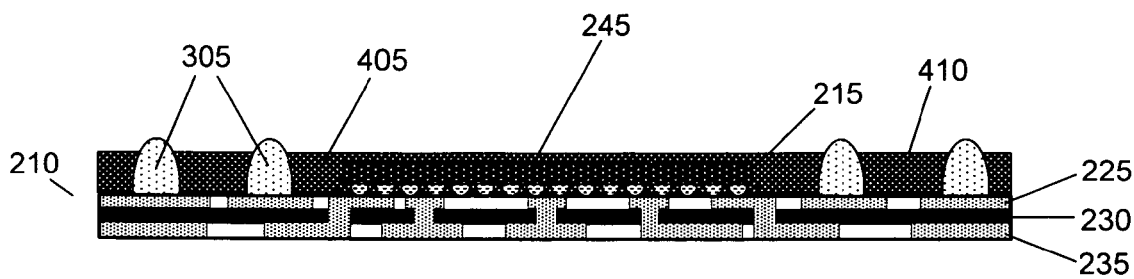
FIG. 5 illustrates an alternate embodiment of the workpiece and attached die of FIG. 3 with a protective layer formed on the workpiece and adjacent to the sacrificial nodules and the die.

FIG. 5 illustrates an alternate embodiment of the workpiece 210 and attached die 215 of FIG. 3 with the protective layer 405 formed on the workpiece 210 adjacent to the sacrificial nodules 305 and the die 215. In this embodiment, a thickness of the protective layer 405 is selectively designed to leave the sacrificial nodules 305 exposed above the protective layer top surface 410, while covering the die top surface 245. In another embodiment (not shown), the protective layer top surface 410 is below the die top surface 245 while providing exposed sacrificial nodules 305.

Figure 6:
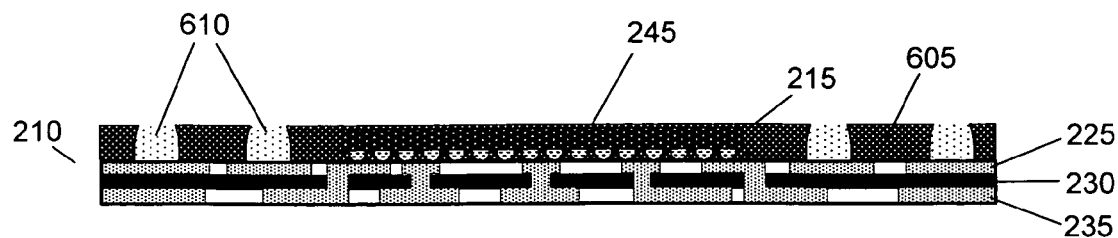
FIG. 6 illustrates the workpiece and attached die of FIG. 4 with exposed sacrificial nodules.

In one embodiment, the protective layer 405 of FIG. 4 is eroded to form a thinned protective layer 605, as shown in FIG. 6. The thinned protective layer 605 is eroded using a backgrind process, a backlap process, a wet etch, a dry etch process, or another process known to one skilled in the art to form exposed nodules 610. A thickness of the thinned protective layer 605 from the die top surface 245 may be up to approximately 300 microns (μm) over the die 215. In another embodiment (not shown), the thinned protective layer 605 may be eroded to expose the die top surface 245 (not shown). Alternatively for the embodiment described in FIG. 5, the sacrificial nodules 305 are already exposed and the protective layer 405 is left intact.

Figure 7:
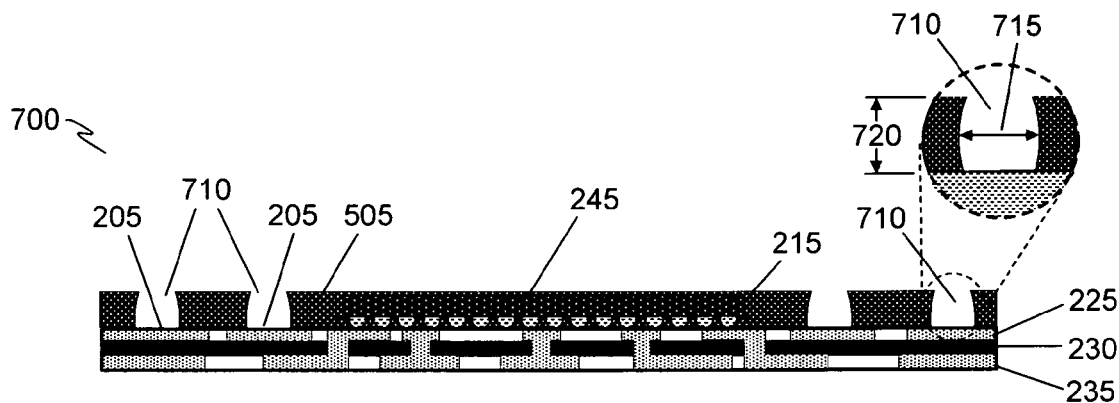
FIG. 7 illustrates the workpiece and attached die of FIG. 6 with cavities formed above at least a portion of the conductive regions.

In element 115, a sacrificial nodule 305 is removed to form a cavity over the conductive region 205. FIG. 7 illustrates the cross-sectional view of FIG. 6 with the sacrificial nodules 305 removed to form cavities 710 over the conductive regions 205 to form a bottom package 700. The cavities 710 created after decomposing the sacrificial nodules 305 may be oblong-shaped with a cavity width 715 ranging substantially between 50 and 500 μm and a cavity height 720 ranging substantially between 50 and 500 μm, as shown in FIG. 7. Each cavity 710 may differ in size and shape depending on its application. Further, each cavity 710 may be substantially circular, rectangular, square, or irregularly shaped. At this intermediate stage, the bottom package 700 may optionally be probed and/or tested and debugged, if necessary.

Figure 8:
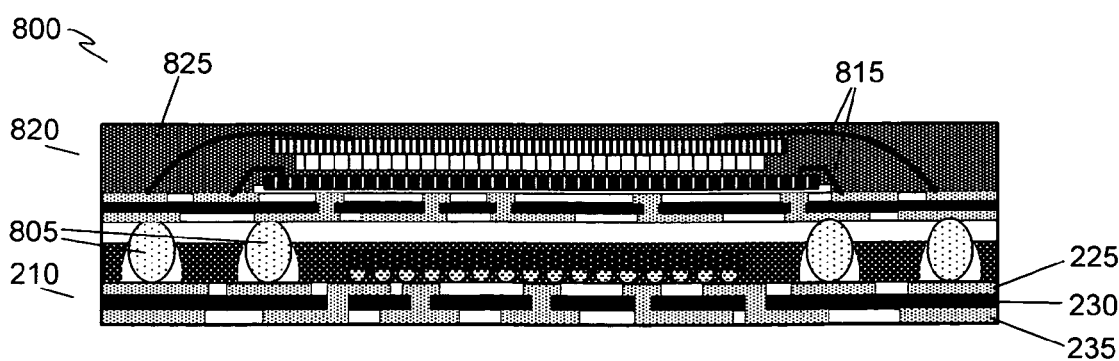
FIG. 8 illustrates a top package positioned on the bottom package of FIG. 7 to form a package-on-package interconnect.

A PoP interconnect 800, shown in FIG. 8 illustrates the bottom package 700 of FIG. 7 with a top package 820 positioned on the bottom package 600. In this embodiment, the top package 820 comprises a solder 805 in electrical contact with metal pads 815 embedded in a capping layer 825 to form an interconnect between the top package 820 and the bottom package 700 of FIG. 7. Flux may optionally be applied to the conductive regions 205 of FIG. 7 or the solder 805 of FIG. 8 before positioning the top package 820 on the bottom package 700. The solder 805 of FIG. 8 are oblong spheres, though the embodiment is not so limited. Other solder shapes such as cylindrical pins or circular sphere may also be used. If applied, the flux (not shown) may be applied using one or more methods known to one skilled in the art including spraying, printing and spin-coating.

The solder 805 may then be reflowed by thermal treatment, using a selectively designed thermal process to reflow the solder 805 to form the PoP interconnect 800. The thermal treatment used to reflow the solder 805 is dependent on the type of solder 805 material used. The solder 805 are formed using one or more materials that are either collapsible, such as a low-melt solder alloy, or effectively non-collapsible such as Cu and Sn/Ag alloys. In another embodiment, the solder 805 are formed of another fusible metal alloy comprising tin, copper, silver, bismuth, indium, zinc, and/or antimony.

A plurality of embodiments of an apparatus and methods for forming a PoP interconnect 800 between a top package 820 and a bottom package 700 have been described. In another embodiment (not shown), a plurality of bottom packages 700 may be stacked with a top package 820 for form another multi-level PoP structure. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of interconnecting workpieces, comprising:
depositing a thixotropic material over conductive regions of a first workpiece;
curing the thixotropic material to form sacrificial nodules on the conductive regions;
coating the first workpiece with a protective layer;
eroding the protective layer to expose the sacrificial nodules;
removing the sacrificial nodules to expose the conductive regions;
providing a second workpiece with a plurality of conductive elements attached to the second workpiece; and
positioning the conductive elements of the second workpiece on the conductive regions.

2. The method of claim 1, wherein the thixotropic material is selected from the group consisting of polyethylene carbonate (PEC), polypropylene carbonate (PPC), polycyclohexane carbonate (PCC), polycyclohexanepropylene carbonate (PCPC), polynorbornene carbonate (PNC), and a copolymer of polynorbornene and polynorbornene carbonate.

3. The method of claim 1, further comprising thermally processing the conductive elements to flow the conductive elements.

4. The method of claim 1, wherein the sacrificial nodules are oblong shaped spheres.

5. The method of claim 1, wherein the first workpiece is a multi-layer organic structure.

6. The method of claim 1, wherein the protective layer is cured when removing the sacrificial nodules.

* * * * *